(12) United States Patent
Okamoto et al.

(10) Patent No.: US 11,875,978 B2
(45) Date of Patent: Jan. 16, 2024

(54) PLASMA PROCESSING APPARATUS AND PLASMA PROCESSING METHOD

(71) Applicant: Hitachi High-Tech Corporation, Tokyo (JP)

(72) Inventors: Tsubasa Okamoto, Tokyo (JP); Tatehito Usui, Tokyo (JP); Miyako Matsui, Tokyo (JP); Shigeru Nakamoto, Tokyo (JP); Naohiro Kawamoto, Tokyo (JP); Atsushi Sekiguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/439,318

(22) PCT Filed: Jun. 16, 2020

(86) PCT No.: PCT/JP2020/023526
§ 371 (c)(1),
(2) Date: Sep. 14, 2021

(87) PCT Pub. No.: WO2021/255812
PCT Pub. Date: Dec. 23, 2021

(65) Prior Publication Data
US 2023/0096723 A1 Mar. 30, 2023

(51) Int. Cl.
H01J 37/32 (2006.01)
H01L 21/3065 (2006.01)
(Continued)

(52) U.S. Cl.
CPC .... H01J 37/32963 (2013.01); H01L 21/3065 (2013.01); H01L 21/31116 (2013.01); H01L 22/26 (2013.01); H01J 2237/334 (2013.01)

(58) Field of Classification Search
None
See application file for complete search history.

(56) References Cited

U.S. PATENT DOCUMENTS 4,675,072 A 6/1987 Bennett
5,195,045 A 3/1993 Keane et al.
(Continued)

FOREIGN PATENT DOCUMENTS

JP H11185998 A 7/1999
JP 2001085388 A 3/2001
(Continued)

OTHER PUBLICATIONS

Non Final Office Action dated Nov. 2, 2021 in U.S. Appl. No. 16/527,520.
(Continued)

Primary Examiner — Roberts P Culbert
(74) Attorney, Agent, or Firm — Miles & Stockbridge, P.C.

(57) ABSTRACT

A plasma processing apparatus 1 that performs, on a wafer 16 in which a multilayer film in which an insulating film and a film to be processed containing a metal are alternately laminated is formed on a substrate, plasma etching of the film to be processed, includes: a processing chamber 10 which is disposed inside a vacuum container; a sample stage 14 which is disposed inside the processing chamber and on which the wafer is placed; a detection unit 28 which detects reflected light obtained by the wafer reflecting light emitted to the wafer; a control unit 40 which controls plasma processing on the wafer; and an end point determination unit 30 which determines an etching end point of the film to be processed based on a change in an amplitude of vibration in a wavelength direction of a light spectrum of the reflected light, and the control unit receives determination of the end (Continued)

point made by the end point determination unit and stops the plasma processing on the wafer.

15 Claims, 12 Drawing Sheets

(51) Int. Cl.
*H01L 21/311* (2006.01)
*H01L 21/66* (2006.01)

(56) References Cited

U.S. PATENT DOCUMENTS

| | | | |
|---|---|---|---|
| 5,712,592 A | 1/1998 | Stimson et al. | |
| 5,770,922 A | 6/1998 | Gerrish et al. | |
| 6,153,115 A | 11/2000 | Le et al. | |
| 6,265,831 B1 | 7/2001 | Howald et al. | |
| 6,270,618 B1 | 8/2001 | Nakano et al. | |
| 6,351,683 B1 | 2/2002 | Johnson et al. | |
| 6,449,038 B1 * | 9/2002 | Stolze | H01L 22/26 356/311 |
| RE38,273 E | 10/2003 | Gerrish et al. | |
| 6,677,711 B2 | 1/2004 | MacGearailt | |
| 6,746,616 B1 | 6/2004 | Fulford et al. | |
| 6,824,813 B1 | 11/2004 | Lill | |
| 6,919,689 B2 | 7/2005 | Jafarian-Tehrani et al. | |
| 7,084,832 B2 | 8/2006 | Pribyl | |
| 7,190,119 B2 | 3/2007 | Patrick et al. | |
| 7,645,357 B2 | 1/2010 | Paterson et al. | |
| 8,038,896 B2 | 10/2011 | Ikegami et al. | |
| 8,546,266 B2 | 10/2013 | Mori et al. | |
| 9,431,268 B2 | 8/2016 | Lill et al. | |
| 9,548,228 B2 | 1/2017 | Chandrashekar et al. | |
| 9,978,610 B2 | 5/2018 | Fung et al. | |
| 2001/0022293 A1 | 9/2001 | Maeda et al. | |
| 2003/0043383 A1 | 3/2003 | Usui et al. | |
| 2003/0211738 A1 | 11/2003 | Nagata | |
| 2004/0185670 A1 | 9/2004 | Hamelin et al. | |
| 2006/0037704 A1 | 2/2006 | Iwata et al. | |
| 2006/0048892 A1 | 3/2006 | Arase et al. | |
| 2006/0287753 A1 | 12/2006 | Plumhoff | |
| 2007/0044716 A1 | 3/2007 | Tetsuka et al. | |
| 2008/0128087 A1 | 6/2008 | Hayano et al. | |
| 2008/0190893 A1 | 8/2008 | Mori et al. | |
| 2008/0268645 A1 | 10/2008 | Kao et al. | |
| 2008/0277062 A1 | 11/2008 | Koshimizu et al. | |
| 2009/0023296 A1 | 1/2009 | Nishizuka | |
| 2010/0258529 A1 | 10/2010 | Mori et al. | |
| 2010/0330805 A1 | 12/2010 | Doan et al. | |
| 2011/0136346 A1 | 6/2011 | Geissbuhler et al. | |
| 2011/0253672 A1 | 10/2011 | Kamibayashi et al. | |
| 2011/0297533 A1 | 12/2011 | Mori et al. | |
| 2013/0228550 A1 | 9/2013 | Mori et al. | |
| 2014/0102640 A1 | 4/2014 | Yokogawa et al. | |
| 2014/0225503 A1 | 8/2014 | Mori et al. | |
| 2014/0288726 A1 | 9/2014 | Miura et al. | |
| 2015/0064914 A1 | 3/2015 | Kong et al. | |
| 2015/0072533 A1 | 3/2015 | Muraki et al. | |
| 2015/0099366 A1 | 4/2015 | Takeda et al. | |
| 2015/0126035 A1 | 5/2015 | Diao et al. | |
| 2015/0179464 A1 | 6/2015 | Wang et al. | |
| 2015/0221518 A1 | 8/2015 | Terakura et al. | |
| 2015/0262829 A1 | 9/2015 | Park et al. | |
| 2015/0270148 A1 | 9/2015 | Shinoda et al. | |
| 2015/0357210 A1 | 12/2015 | Mori et al. | |
| 2016/0005602 A1 | 1/2016 | Yoo et al. | |
| 2016/0035585 A1 | 2/2016 | Xiang et al. | |
| 2016/0240446 A1 | 8/2016 | Matsuda et al. | |
| 2016/0284610 A1 | 9/2016 | Usui et al. | |
| 2016/0293441 A1 | 10/2016 | Lee et al. | |
| 2017/0103893 A1 | 4/2017 | Kulshreshtha et al. | |
| 2017/0358504 A1 | 12/2017 | Usui et al. | |
| 2018/0068862 A1 | 3/2018 | Terakura et al. | |
| 2018/0076048 A1 | 3/2018 | Gohira et al. | |
| 2018/0149809 A1 | 5/2018 | Tsuji | |
| 2018/0277377 A1 | 9/2018 | Eto et al. | |
| 2019/0067032 A1 | 2/2019 | Shinoda et al. | |
| 2020/0043744 A1 | 2/2020 | Ito et al. | |

FOREIGN PATENT DOCUMENTS

| | | |
|---|---|---|
| JP | 2001185542 A | 7/2001 |
| JP | 2002081917 A | 3/2002 |
| JP | 2002343768 A | 11/2002 |
| JP | 2003083720 A | 3/2003 |
| JP | 2003347278 A | 12/2003 |
| JP | 2006066905 A | 3/2006 |
| JP | 2007059567 A | 3/2007 |
| JP | 2008244146 A | 10/2008 |
| JP | 2009135478 A | 6/2009 |
| JP | 2010034582 A | 2/2010 |
| JP | 2010-129884 A | 6/2010 |
| JP | 2011082180 A | 4/2011 |
| JP | 2011228436 A | 11/2011 |
| JP | 2014007370 A | 1/2014 |
| JP | 2015144158 A | 8/2015 |
| JP | 2016152313 A | 8/2016 |
| JP | 2016184638 A | 10/2016 |
| JP | 2018046185 A | 3/2018 |
| JP | 2018088455 A | 6/2018 |
| JP | 2019040932 A | 3/2019 |
| KR | 100263406 B1 | 11/2000 |
| TW | 200620454 A | 6/2006 |
| TW | 200802592 A | 1/2008 |
| TW | 200829087 A | 7/2008 |
| TW | 201533796 A | 9/2015 |
| TW | 201546897 A | 12/2015 |
| TW | 201637093 A | 10/2016 |
| TW | 201730962 A | 9/2017 |
| TW | 201802931 A | 1/2018 |
| TW | 201824341 A | 7/2018 |
| TW | 201841189 A | 11/2018 |
| WO | 2017154407 A1 | 9/2017 |
| WO | 2018052494 A1 | 3/2018 |
| WO | 2020031224 A1 | 2/2020 |

OTHER PUBLICATIONS

Office Action dated Mar. 30, 2023 in Korean Application No. 10-2021-7026679.
Office Action dated Dec. 6, 2021 in Taiwanese Application No. 110121684.
Search Report dated Jul. 14, 2020 in International Application No. PCT/JP2020/023526.
Patrick Verdonck et al.; "Analysis of the Etching Mechanisms of Tungsten in Fluorine Containing Plasmas"; Journal of Electrochemical Society; vol. 142, No. 6, pp. 1971-1976, (Jun. 1995).
Office Action dated Sep. 26, 2018 in Taiwanese Application No. 107106284.
Office Action dated Jul. 13, 2018 in Korean Application No. 10-2014-0013325.
Office Action dated Jul. 13, 2018 in Korean Application No. 10-2015-0053111.
Office Action dated Aug. 9, 2016 in Japanese Application No. 2013-112562.
Office Action dated Jan. 15, 2016 in Taiwanese Application No. 104123764.
Office Action dated Jan. 19, 2015 in Korean Application No. 10-2014-0013325.
STIC Search Report dated Oct. 7, 2014 in U.S. Appl. No. 14/177,251.
Office Action dated Jun. 9, 2020 in Japanese Application No. 2019-110321.
Office Action dated Mar. 11, 2020 in Tawianese Application No. 108125932.
Office Action dated Aug. 27, 2018 in Korean Application No. 10-2017-7020315.
Office Action dated Aug. 30, 2018 in Korean Application No. 10-2018-7015807.

* cited by examiner

[FIG. 1]
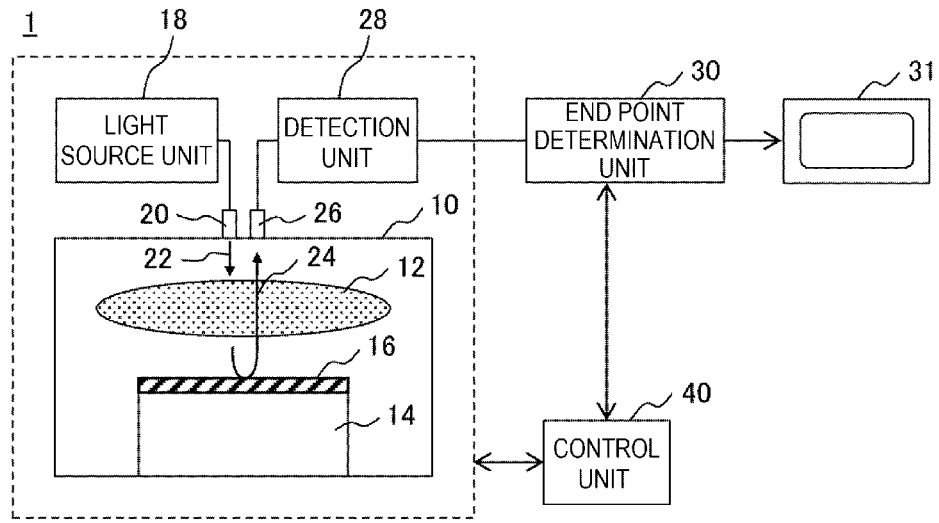
[FIG. 2]
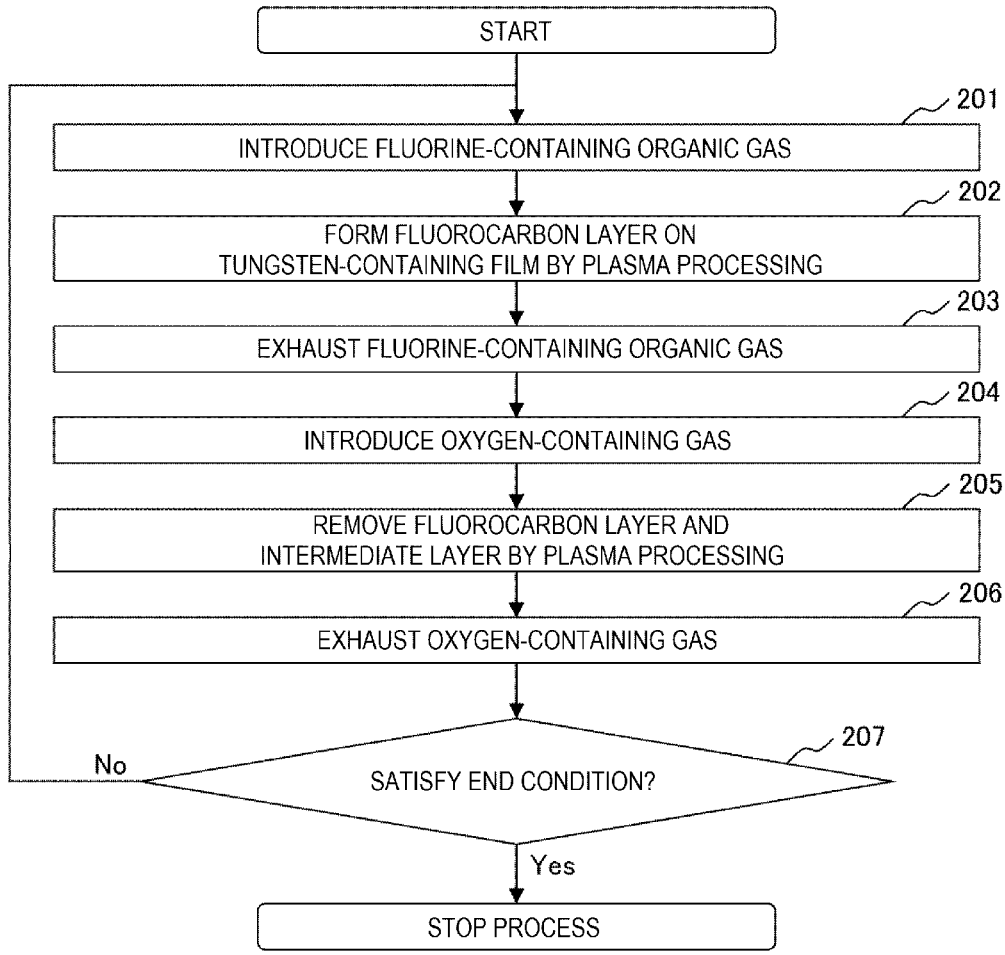

[FIG. 3]
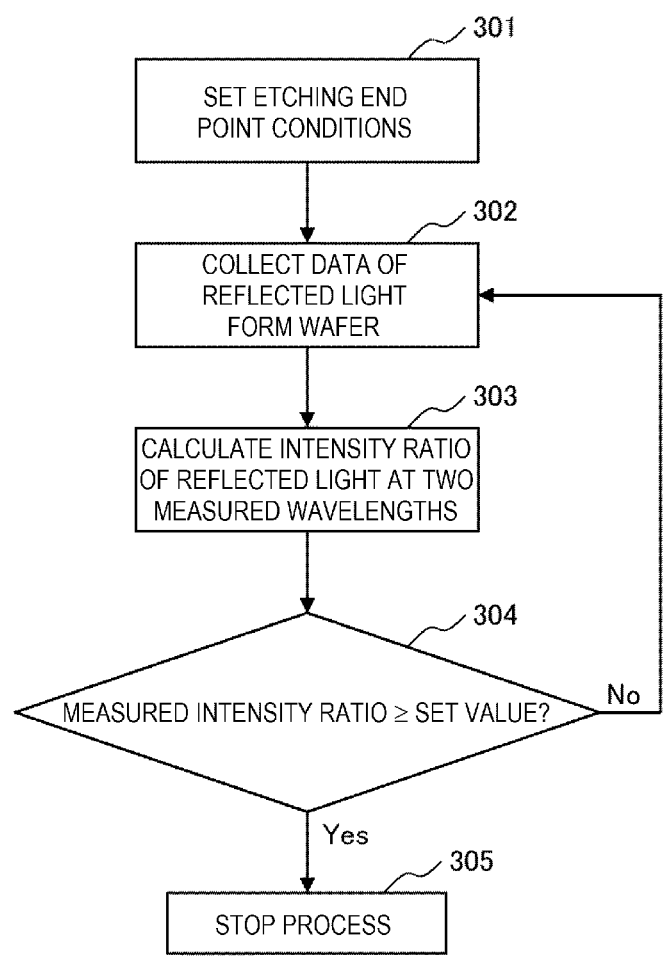

[FIG. 4A]
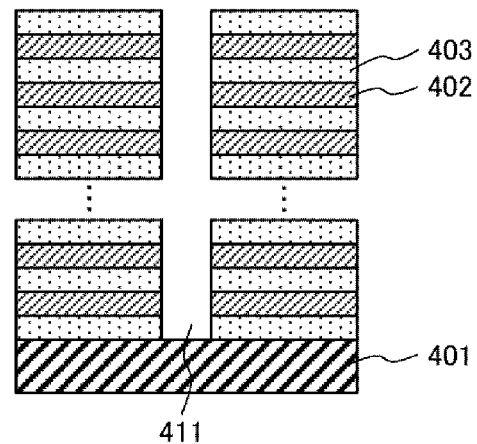
[FIG. 4B]
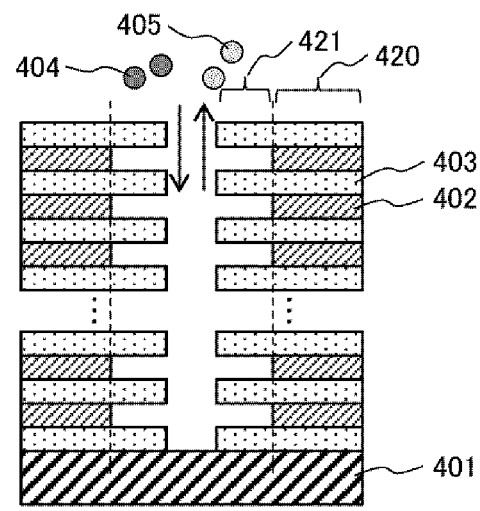
[FIG. 4C]
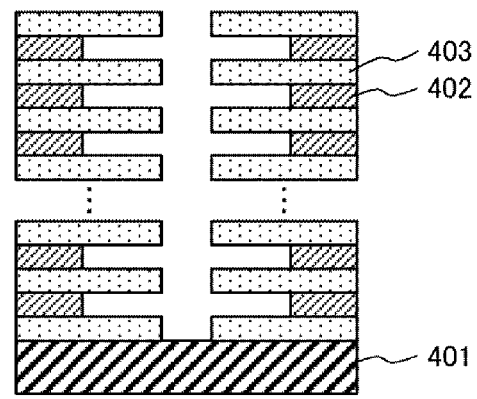

[FIG. 5]
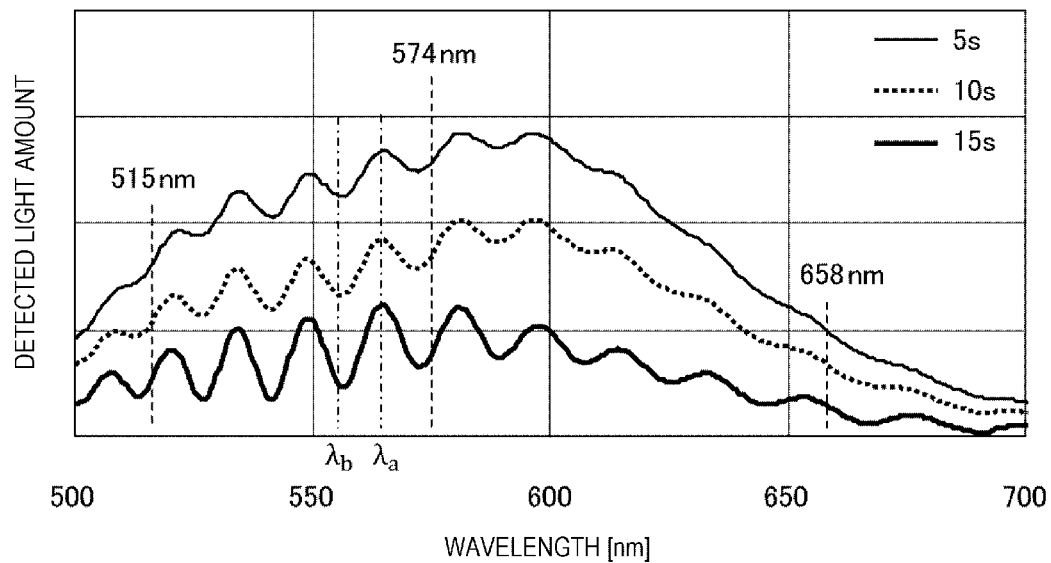
[FIG. 6]
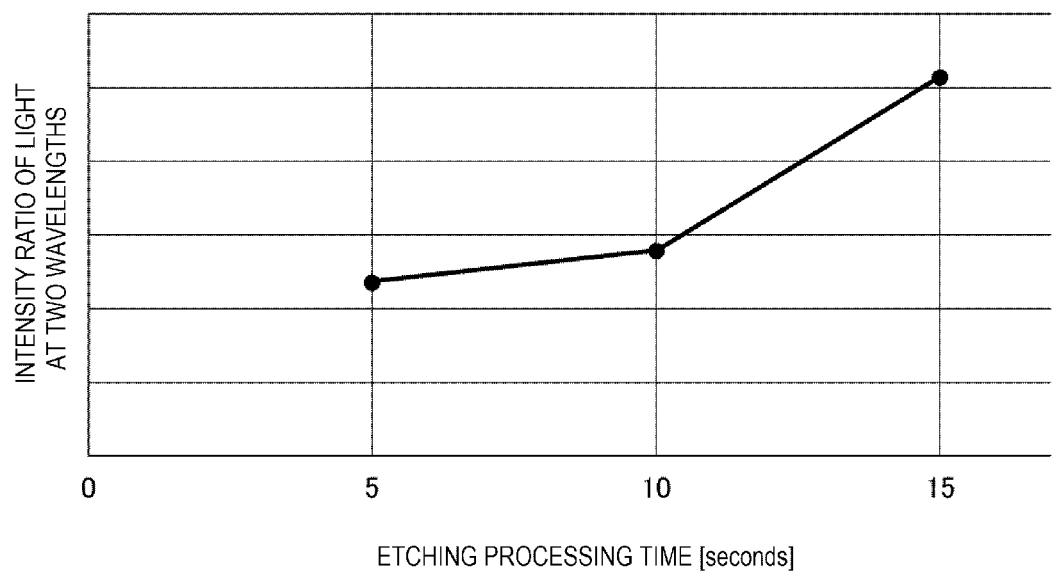

[FIG. 7]
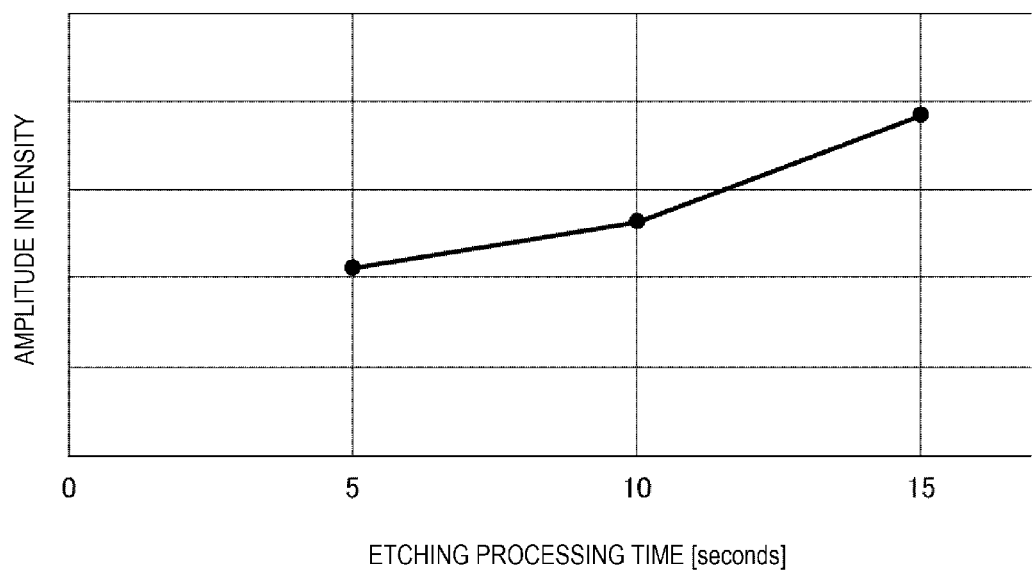

[FIG. 8A]
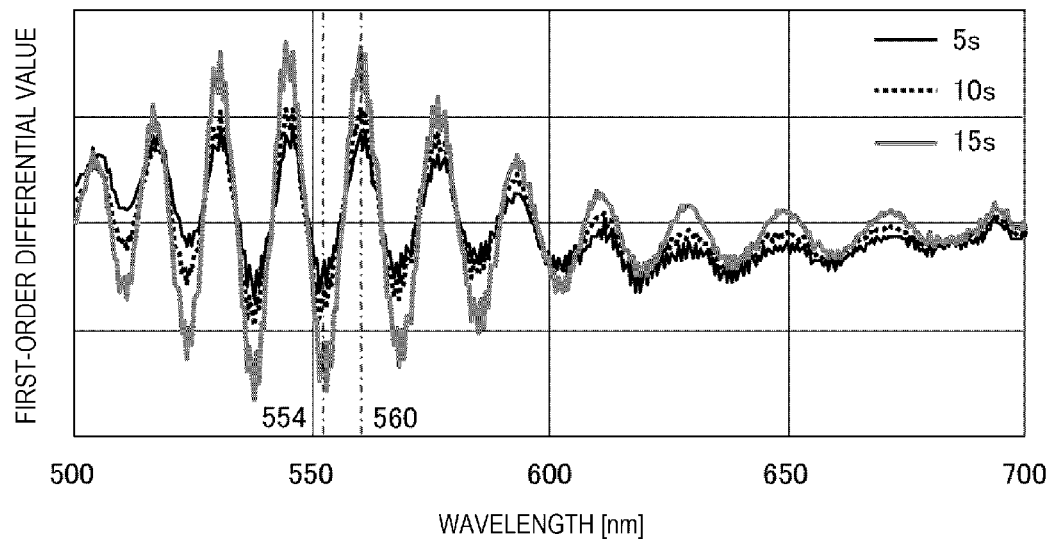
[FIG. 8B]
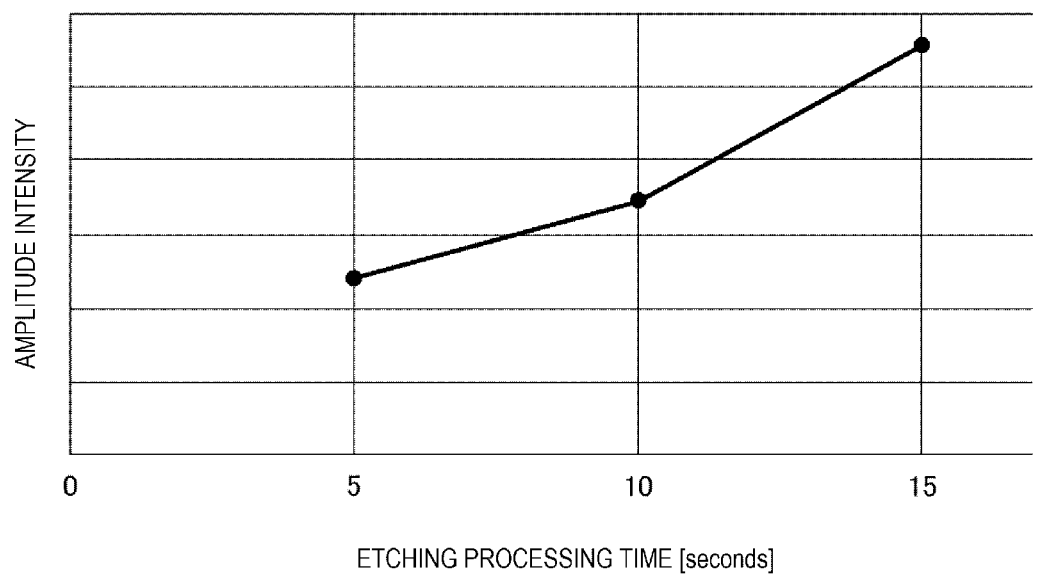

[FIG. 9A]
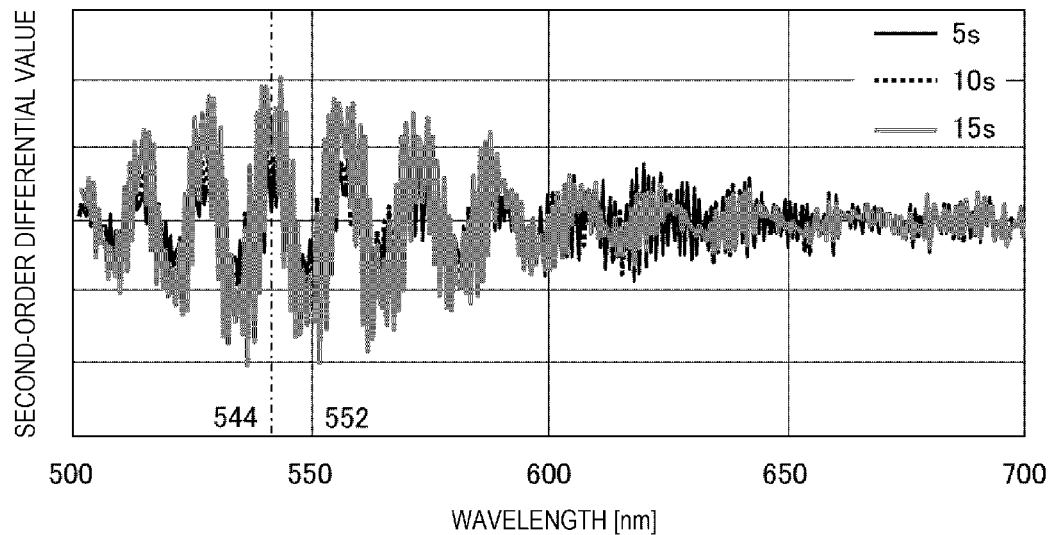
[FIG. 9B]
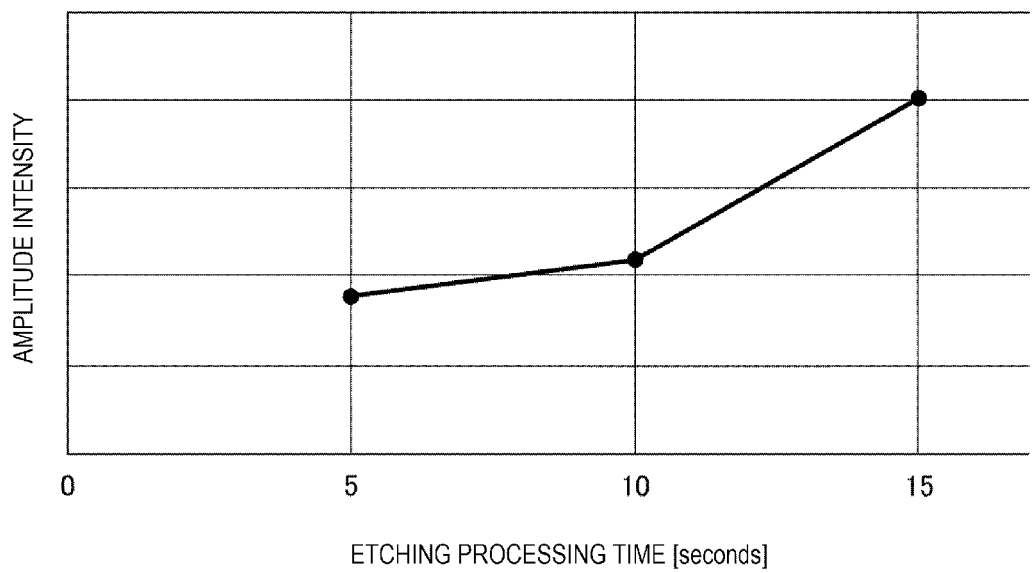

[FIG. 10]
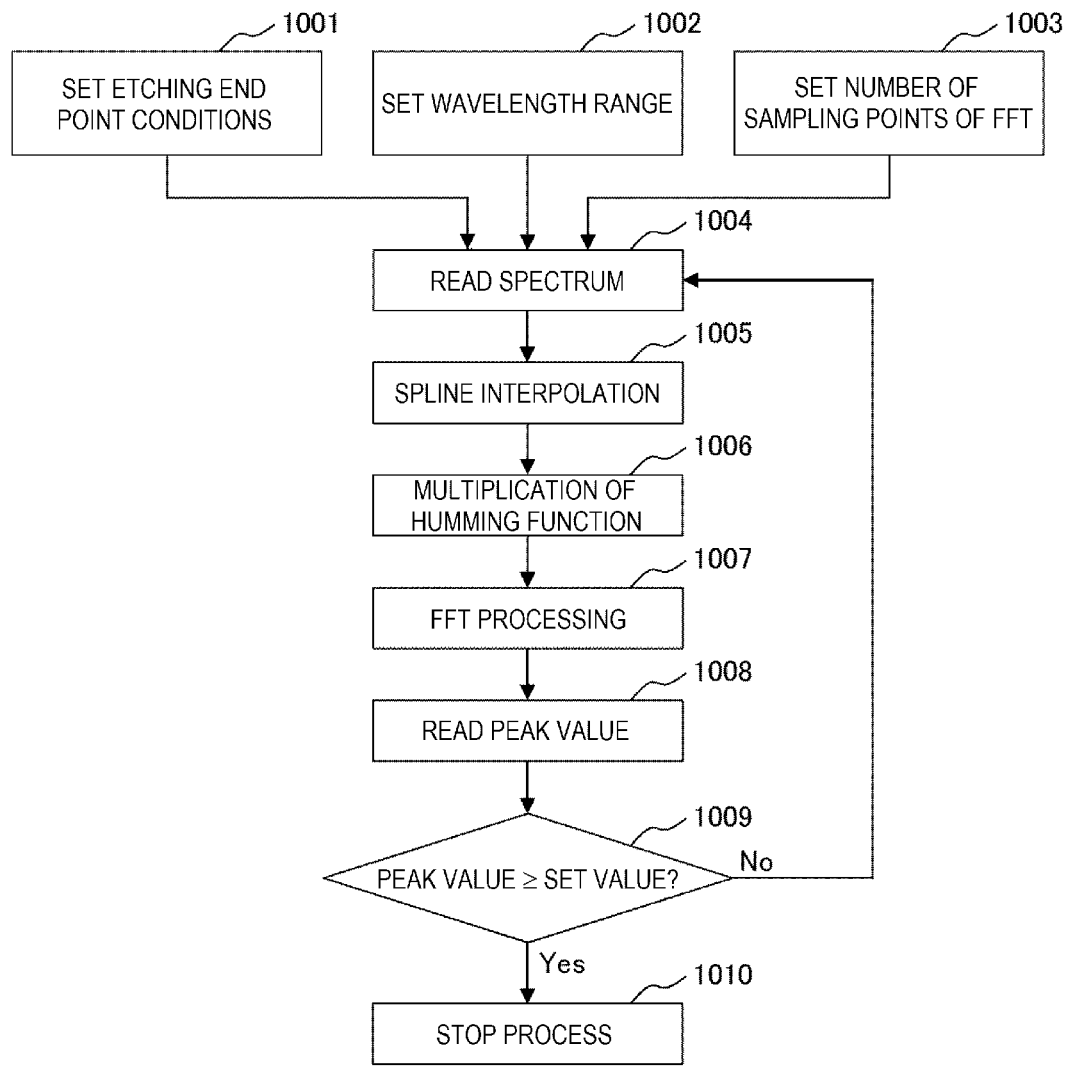

[FIG. 11A]
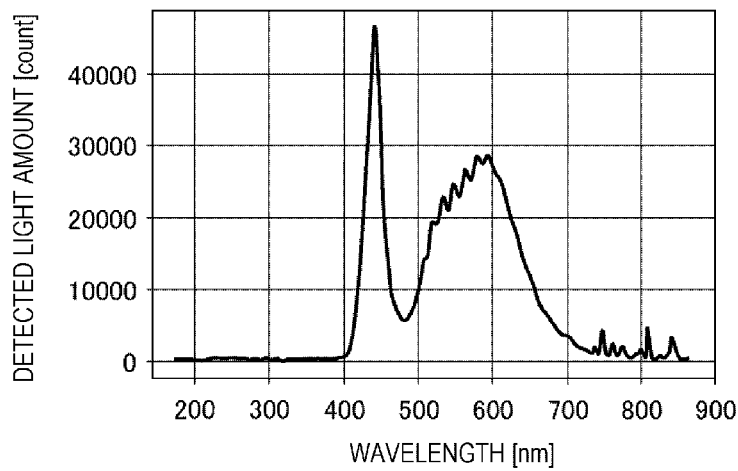
[FIG. 11B]
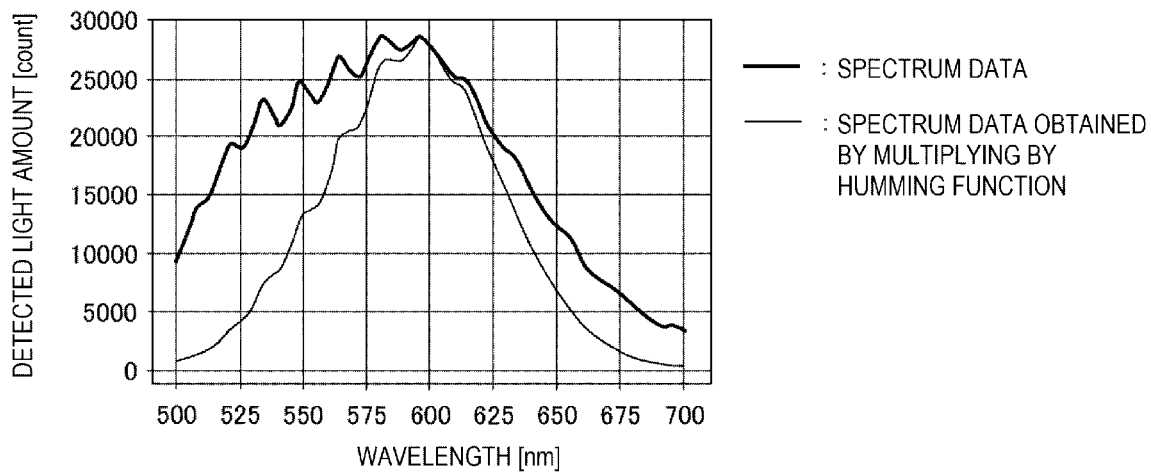
— : SPECTRUM DATA
— : SPECTRUM DATA OBTAINED BY MULTIPLYING BY HUMMING FUNCTION
[FIG. 11C]
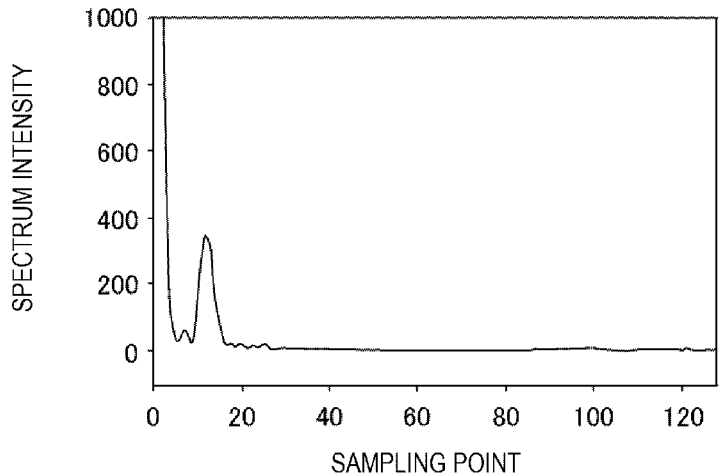

[FIG. 12]
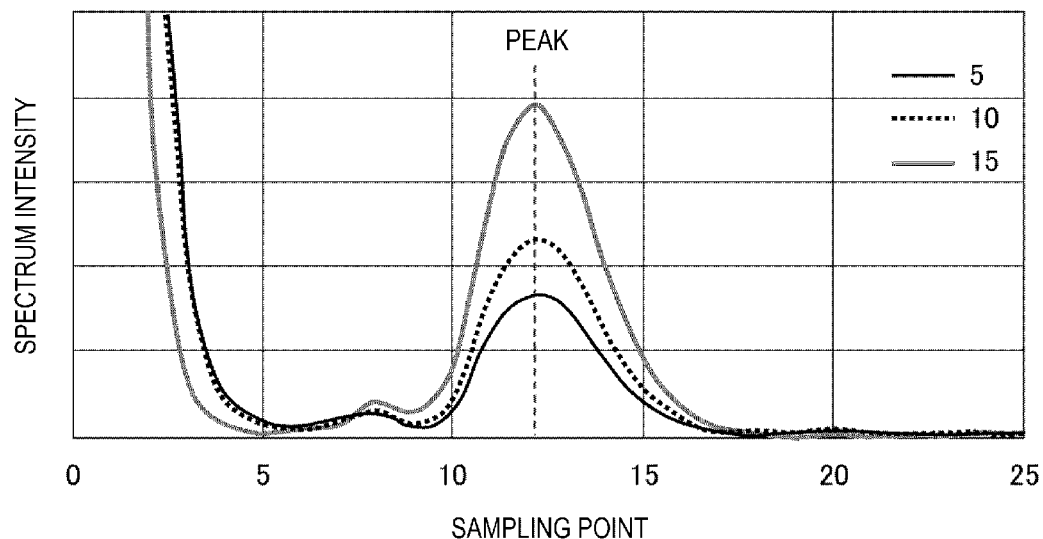
[FIG. 13]
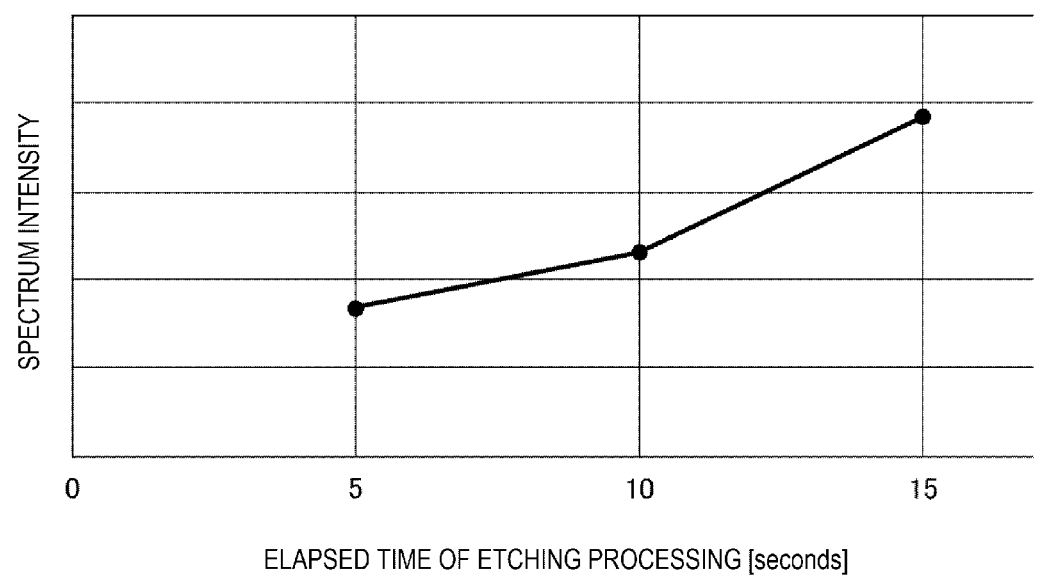

[FIG. 14]
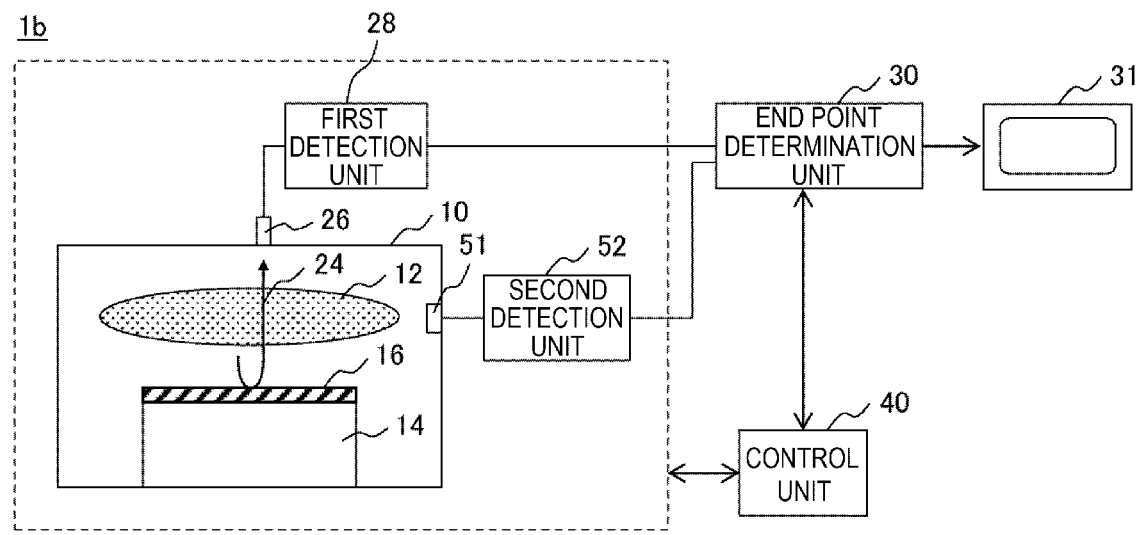

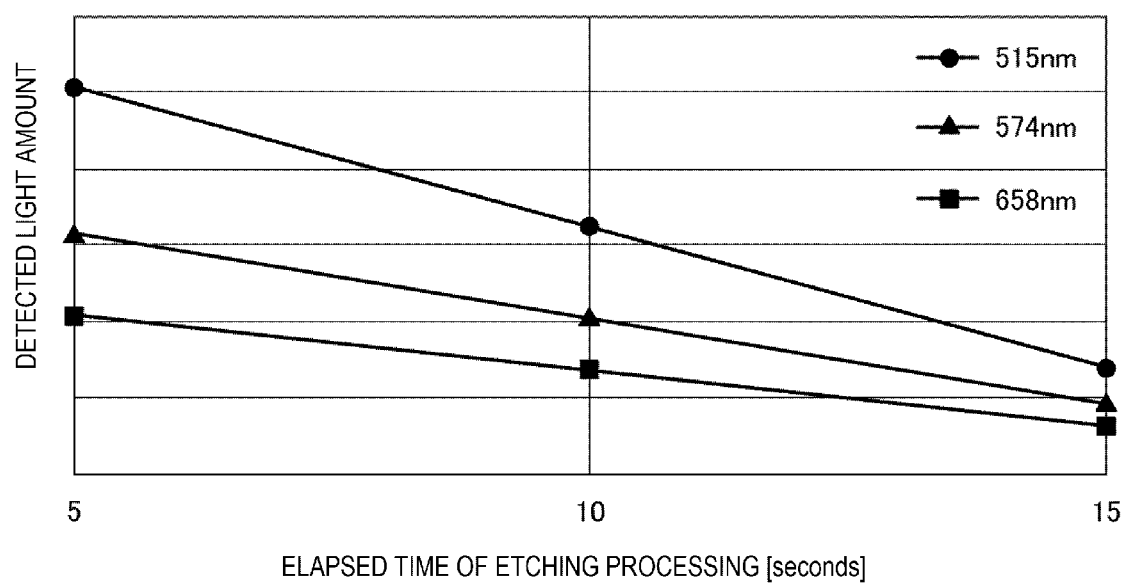
[FIG. 15]

PLASMA PROCESSING APPARATUS AND PLASMA PROCESSING METHOD

TECHNICAL FIELD

The present invention relates to a plasma processing apparatus and a plasma processing method using the same.

BACKGROUND ART

PTL 1 discloses a technique for accurately detecting a residual thickness of a film to be processed in order to improve a yield of etching processing. An object to be etched is a wafer having a film structure in which films to be processed are laminated on a base film, and when the film structure is irradiated with light from plasma, the light is reflected at an inter-film boundary and a surface boundary portion to generate reflected light. Since an optical path difference occurs between the reflected light from the base film and the reflected light from the film to be processed, interference light is generated. An intensity of the interference light changes as the etching progresses and the residual thickness of the film to be processed decreases. Therefore, in the technique disclosed in PTL 1, a result, which is obtained by comparing actual pattern data of an intensity of interference light from the wafer obtained during processing with actual pattern data of an intensity of interference light prepared in advance for reference, is used to calculate an etching amount of the film to be processed at anytime during wafer processing.

CITATION LIST

Patent Literature

PTL 1: JP-A-2016-184638

SUMMARY OF INVENTION

Technical Problem

In PTL 1, the film to be processed in the etching process is assumed to be a film formed in a plane or a film formed on an uppermost layer of the wafer. On the other hand, in a three-dimensional semiconductor device, for a multilayer film (laminated structure) in which two or more types of films are laminated on each other, there may be a process of selectively laterally etching one type of the film. For example, a step of forming a gate electrode of a next-generation 3D-NAND flash memory includes processing in which, from a groove that is formed in a laminated structure of a tungsten film and an insulating film and has a high aspect ratio and a fine width, the tungsten film is etched laterally (a horizontal direction with respect to a vertical depth direction of the groove). In the related art, in such lateral etching, an etching amount is controlled by an etching time. The etching amount can be measured by a difference in weight of the wafer before and after etching. However, when miniaturization of the semiconductor device requires, for example, etching of the tungsten film with high accuracy at an atomic layer level, time control is difficult, and it is necessary to monitor the etching amount to determine an etching end point.

Solution to Problem

Typical ones of the inventions disclosed in the present application will be briefly described as follows.

A plasma processing apparatus that performs, on a wafer in which a multilayer film in which an insulating film and a film to be processed containing a metal are alternately laminated is formed on a substrate, plasma etching of the film to be processed, includes: a processing chamber which is disposed inside a vacuum container; a sample stage which is disposed inside the processing chamber and on which the wafer is placed; a detection unit which detects reflected light obtained by the wafer reflecting light emitted to the wafer; a control unit which controls plasma processing on the wafer; and an endpoint determination unit which determines an etching end point of the film to be processed based on a change in an amplitude of vibration in a wavelength direction of a light spectrum of the reflected light, and the control unit receives determination of the end point made by the end point determination unit and stops the plasma processing on the wafer.

Advantageous Effect

Effects obtained by the typical ones of the inventions disclosed in the present application will be briefly described as follows. The etching amount of the film to be processed can be monitored during processing to determine the end point, which can improve a yield of the etching processing.

Other technical problems and novel characteristics will be apparent from a description of the present description and the accompanying drawings.

BRIEF DESCRIPTION OF DRAWINGS

FIG. 1 is a schematic configuration diagram of a plasma processing apparatus.

FIG. 2 is a flowchart showing an outline of lateral etching processing of a multilayer film.

FIG. 3 is a flowchart of determining a lateral etching end point of a film to be processed.

FIG. 4A is a vertical cross-sectional view of a laminated structure before lateral etching.

FIG. 4B is a vertical cross-sectional view of the laminated structure during the lateral etching.

FIG. 4C is a vertical cross-sectional view of the laminated structure after the lateral etching.

FIG. 5 is a light spectrum detected by irradiating the laminated structure during the lateral etching with external light.

FIG. 6 is a diagram showing a temporal change in an intensity ratio ($I(\lambda_a)/I(\lambda_b)$) of a light intensity $I(\lambda_a)$ of a wavelength $\lambda_a$ and a light intensity $I(\lambda_b)$ of a wavelength $\lambda_b$ with respect to the light spectrum shown in FIG. 5.

FIG. 7 is a diagram showing a temporal change in an amplitude intensity ($I(\lambda_a)-I(\lambda_b)$) obtained based on the light intensity $I(\lambda_a)$ of the wavelength $\lambda_a$ and the light intensity $I(\lambda_b)$ of the wavelength $\lambda_b$ with respect to the light spectrum shown in FIG. 5.

FIG. 8A is a first-order differential light spectrum obtained by performing first-order differential processing on the light spectrum shown in FIG. 5 in a wavelength direction.

FIG. 8B is a diagram showing a temporal change in an amplitude intensity of the first-order differential light spectrum shown in FIG. 8A.

FIG. 9A is a second-order differential light spectrum obtained by performing second-order differential processing on the light spectrum shown in FIG. 5 in the wavelength direction.

FIG. 9B is a diagram showing a temporal change in an amplitude intensity of the second-order differential light spectrum shown in FIG. 9A.

FIG. 10 is a flowchart of determining the lateral etching end point of the film to be processed.

FIG. 11A is a light spectrum obtained by detecting reflected light from a wafer by a detection unit.

FIG. 11B is spectrum data used for FFT processing.

FIG. 11C is a power spectrum obtained by the FFT processing.

FIG. 12 is a diagram showing a temporal change in the power spectrum.

FIG. 13 is a diagram showing a temporal change in a peak value of the power spectrum.

FIG. 14 is a schematic configuration diagram of a plasma processing apparatus.

FIG. 15 is a diagram illustrating a principle of an etching amount measuring method of a comparative example.

DESCRIPTION OF EMBODIMENTS

FIGS. 4A to 4C schematically show a temporal change due to performing plasma etching on a laminated structure formed on a substrate such as a semiconductor wafer. FIG. 4A is a vertical cross-sectional view of the laminated structure before the etching. On a base film (silicon substrate) 401, a groove 411 having a high aspect ratio is formed in a multilayer film (laminated structure) in which tungsten films 402 to be etched and silicon oxide films 403 which are insulating films are alternately laminated. FIG. 4B is a vertical cross-sectional view of the laminated structure during the lateral etching. In order to etch the tungsten films 402, a fluorine-containing gas is used to generate plasma. A fluorine-containing reaction species 404 in the plasma is supplied into the groove 411 and reacts with surfaces of the tungsten films 402 to produce a reaction product 405 containing tungsten. By removing the reaction product 405 upward, etching of the tungsten films 402 proceeds. FIG. 4C is a vertical cross-sectional view of the laminated structure after the etching.

The inventors examine a method of monitoring an etching amount of the lateral etching using an intensity of interference light. Details of a data acquisition method will be described later, and when reflected light is detected by irradiating the laminated structure with light (external light) from an external light source during the lateral etching of the laminated structure shown in FIGS. 4A to 4C, a light spectrum (a waveform showing an intensity of light at each wavelength) as in FIG. 5 is observed. FIG. 5 shows light spectra 5 seconds (thin solid line), 10 seconds (broken line), and 15 seconds (thick solid line) after start of the lateral etching.

The detected intensity of the light at each wavelength is mainly determined by an intensity of light at each wavelength of a light source emitted to a wafer and a spectral reflectance of a laminated structure during processing. Before the start of the etching, as shown in FIG. 4A, positions of ends of the tungsten films 402 and the silicon oxide films 403 on a groove 411 side are the same. Tungsten has metallic properties and has a reflectance of about 1 at each wavelength in an ultraviolet to infrared region, and therefore before the start of the etching, most of the emitted external light is reflected by the tungsten film on an uppermost layer, so that the light spectrum of the external light is detected almost as it is.

Then, in a state where the lateral etching of the tungsten films 402 is progressed, as shown in FIG. 4B, there is a region 420 in which silicon oxide and tungsten are bordered and laminated in a vertical direction, and a region in which tungsten is removed, in other words, a region 421 in which silicon oxide and vacuum are bordered and laminated in the vertical direction. In this state, for most of the external light emitted to the region 420, light reflected by the tungsten film on the uppermost layer is detected. On the other hand, the external light emitted to the region 421 is reflected and transmitted according to a refractive index of the silicon oxide. Since the region 421 is a structure in which a plurality of films are laminated, multiple reflections occur in the silicon oxide film of each layer, and the external light is detected as interference light.

The intensity of the interference light vibrates in a wavelength direction as shown in FIG. 5, and a period and phase of the vibration depend on a material of a film, on which multiple reflections occur, and a film thickness of each layer. The materials constituting the laminated film of the region 421 are silicon oxide and vacuum, and therefore the period of the vibration of the detected spectrum is determined by the film thickness of each silicon oxide film laminated in the vertical direction because the vacuum has a refractive index of 1, which can be ignored.

From the above, the light spectrum detected by irradiating the laminated structure during the lateral etching shown in FIGS. 4A to 4C with the external light is a sum of an intensity of reflected light from the region 420 and an intensity of interference light from the region 421. Further, as the etching process of the tungsten film of the laminated structure progresses, widths of the regions 420 and 421, in other words, an aperture ratio on a surface of the wafer changes, and as a result, the light spectrum detected as the lateral etching progresses changes as a ratio of the intensity of the light from the region 420 to the intensity of the light from the region 421 changes. In a process of processing the tungsten film in the laminated structure of the tungsten film and the silicon oxide film, selectivity for the silicon oxide film is very high, and the thickness of each layer in the vertical direction of the region 421 does not change during the etching processing, so that the period and phase of the vibration in the wavelength direction of the interference light from the region 421 do not change throughout the etching period.

Estimation of a progress of the lateral etching from the light spectrum that appears during the etching as shown in FIG. 5 will be examined. As a case (comparative example), use of a temporal change in light intensity of a predetermined wavelength will be examined. FIG. 15 shows temporal changes in light intensities at wavelengths of 515 nm (circle), 574 nm (triangle), and 658 nm (square) with respect to the light spectrum in FIG. 5. As described above, since the period and phase of the vibration in the wavelength direction of the interference light from the region 421 do not change throughout the etching period, a light intensity at a specific wavelength is determined by a ratio of the region 420 to the region 421 on the surface of the wafer. Since the intensity per unit area of the reflected light from the region 420 is larger than the intensity per unit area of the interference light from the region 421, the light intensity at each wavelength monotonically decreases.

As described above, theoretically, the progress of the etching can be detected based on a temporal change in an intensity change at a certain wavelength in a light spectrum. However, since various noise components are actually added to a light intensity detected from a detector, it is common to perform signal processing such as time differentiation to separate signal components and the noise components.

However, in this case, the signal components decrease monotonically with time, when the time differentiation is applied to a light amount at a predetermined wavelength, a temporal change rate of the light amount is constant regardless of the etching amount, and therefore a correspondence between the light intensity and the lateral etching amount is lost. Therefore, in order to estimate the lateral etching amount from the relation in FIG. 15, there is a limit in terms of accuracy because the signal processing for removing the noise components is restricted.

On the other hand, in an etching end point determination method of this embodiment, the etching amount is accurately measured by utilizing the vibration in the wavelength direction of the light spectrum. Hereinafter, a configuration of a plasma processing apparatus including an end point determination unit capable of accurately controlling the etching amount and an end point determination method will be described with reference to the drawings.

(Plasma Processing Apparatus)

FIG. 1 shows a schematic configuration of a plasma processing apparatus 1. The plasma processing apparatus 1 includes a processing chamber 10 disposed inside a vacuum container. Above and around the processing chamber 10, a coaxial cable and an antenna, or an electric field generator such as a waveguide that propagates microwaves, or a magnetic field generator such as a solenoid coil (not shown) is disposed. Radio frequency power is supplied to the electric field generator or magnetic field generator, and a radio frequency electric field or a radio frequency magnetic field is supplied to the inside of the processing chamber 10.

Further, a ceiling surface of the processing chamber 10 is provided with a plurality of introduction holes for introducing a gas for processing a wafer 16 placed and held on an upper surface of a sample stage 14. These introduction holes are connected to a gas introduction mechanism including a gas supply path such as a pipe and a mass flow controller (MFC) disposed upstream of the gas supply path (not shown).

The wafer 16 to be plasma-processed is held with being adsorbed by static electricity on a placement surface configured with a dielectric of the sample stage 14. A heat transfer gas such as He gas is supplied between a back surface of the wafer 16 and the placement surface of the sample stage 14, thereby promoting heat conduction between the wafer 16 and the sample stage 14.

Further, below the vacuum container containing the processing chamber 10 therein, an exhaust device such as a turbo molecular pump that exhausts gases and particles inside the processing chamber 10 to reduce a pressure inside is disposed. The exhaust device communicates with an exhaust port disposed on a bottom surface of the processing chamber 10 below the sample stage 14, and an exhaust pipeline between the exhaust device and the exhaust port is provided with an exhaust control valve that increases or decreases a cross-sectional area of an inner flow path to changes a flow rate or speed of exhaust.

An etching processing gas is introduced by the gas introduction mechanism into the processing chamber 10 whose pressure is reduced by an operation of the exhaust device, and the pressure in the processing chamber 10 is adjusted to a pressure, which is suitable for starting the plasma processing, by a balance between an exhaust amount and a gas supply amount. In this state, the radio frequency electric field or the radio frequency magnetic field is supplied, and atoms or molecules of the etching processing gas are ionized or dissociated by interaction, and plasma 12 is formed in a space above the sample stage 14 in the processing chamber 10.

In the present embodiment, charged particles and active species particles having high reactivity (activity) by dissociating in the plasma are diffused or induced on an upper surface of the wafer 16 and a film to be processed (film to be processed) in a multilayer film formed on the wafer 16 is etching-processed (plasma-processed).

Operations of the plasma processing apparatus 1 including selection of a type of the gas to be introduced into the processing chamber 10, controls of an introduction amount and exhaust amount of the gas, ignition, generation and extinguishing of the plasma 12, and a strength and distribution of an electric or magnetic field for the ignition, generation and extinguishing, transporting and holding of the wafer 16 on the sample stage 14, supply and stop of the radio frequency power for forming a bias potential to an electrode disposed in the sample stage 14, and the like, are performed based on command signals from a control unit 40 communicatively connected to each device performing each of the operations. The control unit 40 has a function of adjusting synchronization and timing between devices in order to obtain results of the etching process desired by a user.

Further, the plasma processing apparatus of the present embodiment includes a monitor that measures the etching amount of the wafer 16 to be plasma-processed and an end point determination unit. Details of these configurations will be described later.

(Lateral Etching Process)

It is assumed that a laminated film including the tungsten films as shown in FIG. 4A is formed on the wafer 16. FIG. 2 is a flowchart showing an outline of the etching processing of the laminated film that is formed in the wafer 16 and includes the tungsten films.

In step 201, a fluorine-containing organic gas is introduced into the processing chamber 10. In addition to $C_4F_8$, $CHF_3$, $CH_2F_2$, $CH_3F$, and the like, the fluorine-containing organic gas may be a mixed gas obtained by diluting these gases with argon, nitrogen, oxygen, and the like.

In step 202, the plasma 12 is generated in the processing chamber 10, and radicals (active species) such as $CF_x$ generated by activating atoms or molecules of the fluorine-containing organic gas are supplied to a surface of the wafer 16 and adhere to a surface of the tungsten film. Here, the tungsten film is not limited to a single tungsten film, and may be a metal film containing a plurality of elements including tungsten. For example, the tungsten film may be a WN film, or a $WSi_2$ film. Reactive particles such as radicals react with a material of the adhered surface of the tungsten film to form a fluorocarbon layer. A thickness of the formed fluorocarbon layer depends on a generation condition of the plasma 12 and a processing condition such as a temperature of the sample stage 14.

Examples of compositions of the fluorocarbon layer generated on the surface of the tungsten film include, in addition to $CF_x$, $CH_xF_y$ generated when hydrogen-containing plasma is used, and the like. $CH_xF_y$ is referred to as a hydrofluorocarbon layer, but here a term of fluorocarbon layer is used since the fluorocarbon layer also includes the hydrofluorocarbon layer. An intermediate layer, which includes tungsten and fluorine and has a self-saturability, is formed at a boundary between the surface of the tungsten film and the fluorocarbon layer. A thickness of the formed intermediate layer changes depending on a temperature of the surface of the sample stage 14 or the wafer 16. Therefore, the thickness of the intermediate layer is adjusted by controlling the temperature of the sample stage 14.

In step 203, after the control unit 40 confirms that an intermediate layer having a predetermined thickness is formed by a detector or by confirming passage of a predetermined time or the like, the exhaust amount is increased by controlling the exhaust control valve to increase a flow path cross-sectional area of a pressure regulation vacuum exhaust pipe, the inside of the processing chamber 10 is greatly depressurized, and the fluorine-containing organic gas supplied into the processing chamber 10 is quickly exhausted. Accordingly, forming processing of the fluorocarbon layer is ended. At this time, an inert (rare) gas such as Ar may be supplied to the inside of the processing chamber 10 so as to replace the organic gas to promote the discharge of the organic gas.

In step 204, an oxygen-containing gas is introduced into the processing chamber 10 as a reaction gas for removing the fluorocarbon layer and the intermediate layer. In addition to $O_2$, or $O_3$, the oxygen-containing gas may be a mixed gas obtained by diluting these gases with argon, nitrogen, and the like.

In step 205, the plasma 12 is generated in the processing chamber 10, and the radicals (active species) generated by activating atoms or molecules of the gas are supplied to the surface of the wafer 16. As a result, a reaction between the active species containing oxygen radicals and the fluorocarbon layer and the intermediate layer occurs, and a reaction product having volatility is generated. Due to the volatility, the reaction product is removed from the surface of the tungsten film by sublimation or desorption from the laminated film.

Examples of the reaction product include CO, $CO_2$, $COF_x$, $WF_x$, $WO_xF_y$, and the like. Particles of these reaction product desorbed from the wafer 16 are discharged from the processing chamber 10 by an exhaust operation inside the processing chamber 10 caused by the operations of the exhaust control valve and the exhaust device, and by a resulting flow of particles inside the processing chamber 10.

In step 206, the oxygen-containing gas is exhausted from the processing chamber 10.

By removing the intermediate layer together with the fluorocarbon layer by one cycle in which the above steps 201 to 206 are put together, the tungsten film is removed by the thickness of these layers.

(Monitor)

As shown in FIG. 1, the plasma processing apparatus 1 of the present embodiment includes a monitor that measures an etching amount that reflects a lateral groove depth formed by lateral etching during plasma processing. The monitor includes a light source unit 18 that emits external light with which the inside of the processing chamber 10 is irradiated; a lens 20 that is disposed on the ceiling surface of the processing chamber 10 and through which the external light from the light source unit 18 connected therewith by an optical fiber is emitted to the wafer 16 in the processing chamber 10; a lens 26 that is disposed on the ceiling surface of the processing chamber 10 and receives light reflected from the wafer 16 in the processing chamber 10; a detection unit 28 that is connected to the lens 26 by an optical fiber and detects an intensity of the received light; and an end point determination unit 30 that determines an etching end point based on the etching amount of the wafer 16 during the plasma processing from a detection signal from the detection unit 28. The etching amount calculated based on endpoint determination information or the detection signal obtained by the end point determination unit 30 is displayed on a display unit 31.

The external light from the light source unit 18 propagates through the optical fiber, is introduced from the ceiling surface of the processing chamber 10 via the lens 20, and is emitted on the upper surface of the wafer 16 as irradiation light 22. As the external light emitted from the light source unit 18, continuous light from ultraviolet to infrared is used. Instead of a light source that emits the continuous light, a light source that emits light of a specific wavelength may be used depending on the endpoint determination method. Reflected light 24 obtained by irradiating the irradiation light 22 on the wafer 16 is collected by the lens 26 for detection. As described with reference to FIGS. 4A to 4C, the reflected light 24 includes the reflected light from the region 420 and the reflected light from the region 421. The reflected light 24 collected by the lens 26 propagates through the optical fiber and is introduced into the detection unit 28.

The detection unit 28 includes a spectroscope, separates the introduced reflected light into a plurality of wavelengths by the spectroscope, and detects the intensity of light of each wavelength. When the etching end point is determined based on the light intensity at the specific wavelength, the light of the specific wavelength can be selectively detected by using a photodetector and providing a monochromator or the like in front of the photodetector. When a light source having the specific wavelength is used as the light source, the light may be detected directly by the photodetector.

As shown in FIG. 1, the lens 20 and the lens 26 are disposed on the ceiling surface of the processing chamber 10. However, since a gas introduction port and a shower plate for evenly supplying the reaction gas or the like to the processing chamber 10 are generally provided directly above the wafer 16, the lens 20 and the lens 26 cannot be disposed directly above the wafer 16 in some cases. In such a case, the lens 20 and the lens 26 are disposed at a distance from each other such that the optical paths of the irradiation light 22 and the reflected light 24 are not obstructed. In this case, it is desirable to obliquely dispose the lenses to the ceiling surface of the processing chamber 10 such that the optical path of the irradiation light 22 and the optical path of the reflected light 24 (the optical path of the reflected light 24 is an optical path formed by mirror reflection of the irradiation light 22 on the wafer 16) coincide with an optical axis of the lens 20 and an optical axis of the lens 26, respectively.

When the lenses can be disposed directly above the wafer 16, the lens 20 and the lens 26 may be configured by one lens in order to make the optical paths of the irradiation light 22 and the reflected light 24 the same. In this case, the optical axis of one lens is perpendicular to the wafer 16, the irradiation light 22 is perpendicularly emitted to the wafer 16, and the reflected light 24 reflected perpendicularly is detected.

Further, a plurality of sets each including the light source unit 18, the lenses 20 and 26, and the detection unit 28 may be provided, and the etching amount may be detected and the end point may be determined at a plurality of locations in a radial direction of the upper surface of the wafer 16. In this case, the stop of the process may be controlled based on a weighted average of the etching amounts obtained by weighting the etching amounts detected at the plurality of locations.

The detection unit 28 detects an intensity of the reflected light 24 from the wafer 16, transmits the detection signal to the end point determination unit 30, and the etching end point of the wafer 16 that is laterally etched may be determined according to a determination method to be described later.

(Lateral Etching End Point Determination Method)

FIG. 3 is a flowchart of the end point determination unit 30 determining the lateral etching end point of the film to be processed of the wafer 16.

In the lateral etching end point determination method in the present embodiment, attention is paid to an amplitude of the vibration in the wavelength direction of the light spectrum during the lateral etching processing. In the example of FIG. 5, it can be seen that the amplitude is remarkable in the wavelength range of about 500 nm to 600 nm, and the amplitude of the vibration in the wavelength direction increases as the etching period increases. It is considered that a reason why the amplitude increases is that a ratio of the interference light from the region 421 (see FIG. 4B) to the reflected light from the wafer increases as the etching progresses. This means that the lateral etching amount can be calculated based on the temporal change in the amplitude in the wavelength direction. Therefore, in the flowchart of FIG. 3, for the multilayer film to be etched formed on the wafer, two wavelengths for measuring the light intensity of the reflected light from the wafer are set, and when an intensity ratio of the reflected light of the two wavelengths reaches a predetermined set value, the etching end point is determined.

First, for the multilayer film formed on the wafer and to be laterally etched, two wavelengths for measuring the light intensity are set, and an intensity ratio of the reflected light at the two wavelengths, which is the etching end point of the wafer, is set (step 301). This set value is stored in an external storage device such as a hard disk drive (HDD) or compact disk-read only memory (CD-ROM) of the control unit 40 or a storage device of a semiconductor memory device such as a random access memory (RAM) or ROM, then data of the set value read by the control unit 40 is transmitted to the end point determination unit 30 configured to communicate with the control unit 40, and is used to determine the etching end point.

Here, as the two wavelengths to be monitored, two wavelengths may be selected at which the temporal change in the amplitude in the wavelength direction is reflected in the ratio of the light intensities at the two wavelengths. However, as the change in the light intensity ratio appears large, robust measurement can be performed for noise and the like, and therefore in the case of FIG. 5, it is desirable to select a peak wavelength and a valley wavelength of the vibration in the wavelength direction of the light spectrum near 550 nm as the two wavelengths. In this way, since a suitable wavelength changes depending on the material of the laminated structure to be etched, a type of the external light source, that is, characteristics of the light spectrum of the external light (irradiation light), the two wavelengths to be measured are set according to the laminated structure to be etched.

The control unit 40 starts the processing of the wafer, and the detection unit 28 detects the light spectrum of the reflected light from the wafer obtained during the processing. The detected light spectrum is input into the end point determination unit 30 (step 302). Here, the light intensity of the detected reflected light may include light intensities of at least two wavelengths, which are set as the etching end point condition, and may be a light spectrum of continuous light or light intensities of two wavelengths set as the measurement wavelengths.

Next, the endpoint determination unit 30 calculates the intensity ratio (referred to as measured intensity ratio) for the input light intensity data of two wavelengths by the same calculation formula as the intensity ratio set in step 301 (step 303).

Next, the end point determination unit 30 compares the measured intensity ratio with the set value (step 304). When it is determined that the measured intensity ratio is less than the set value, the process returns to step 302. When it is determined that the measured intensity ratio is equal to or greater than the set value, the end point determination unit 30 determines that a target etching amount is reached, and transmits a signal of ending the process to the control unit 40 (step 305).

The control unit 40 receives the process end signal and issues a command signal of ending the process to each mechanism of the plasma processing apparatus 1. Specifically, by stopping the generation of the radio frequency electric field or the radio frequency magnetic field and stopping supply of the radio frequency power to the electrode in the sample stage 14, the plasma 12 is extinguished and the etching process is stopped.

Thereafter, adsorption of the wafer 16 to the sample stage 14 due to static electricity is released, the wafer 16 is transported to the outside of the processing chamber 10, and next processing of the wafer 16 is started as needed. At this time, control parameters of the etching processing may be changed according to the wafer. The etching processing may be performed on a plurality of wafers without extinguishing the plasma 12.

FIG. 6 is a diagram showing a temporal change in an intensity ratio $(I(\lambda_a)/I(\lambda_b))$ of a light intensity $I(\lambda_a)$ of a wavelength $\lambda_a$ (564 nm) and a light intensity $I(\lambda_b)$ of a wavelength $\lambda_b$ (556 nm) with respect to the light spectrum shown in FIG. 5. In this example, the wavelength $\lambda_a$ (564 nm) is a peak of the vibration, and the wavelength $\lambda_b$ (556 nm) is a valley of the vibration. In this way, it is observed that the measured intensity ratio of the two wavelengths increases monotonically with etching time. Therefore, the etching processing end point can be determined by examining in advance the intensity ratio of the reflected light at two wavelengths at the time when the lateral etching amount of the laminated structure to be etched reaches the desired etching amount and setting the intensity ratio as a threshold value. In addition, since the temporal change in the intensity ratio of the reflected light at the two wavelengths corresponds to a change in the widths of the regions 420 and 421 (see FIG. 4B), the etching amount at that time can be calculated based on the intensity ratio of the reflected light at the two wavelengths. The same applies to other end point determination methods to be described below.

In FIG. 3, the determination is made using the intensity ratio of the reflected light at two wavelengths as an index, but the determination is not limited thereto. The intensity ratio of reflected light at two or more wavelengths may be used as an index. Further, the index is not limited to the intensity ratio, and an amplitude intensity of the vibration in the wavelength direction of the light spectrum can be used as an index. FIG. 7 shows a temporal change in an amplitude intensity $(I(\lambda_a)-I(\lambda_b))$ obtained based on the light intensity $I(\lambda_a)$ of the wavelength $\lambda_a$ (564 nm) and the light intensity $I(\lambda_b)$ of the wavelength $\lambda_b$ (556 nm) with respect to the light spectrum shown in FIG. 5. In this way, it is observed that the amplitude intensity increases monotonically with the etching time. Therefore, the etching processing end point can be determined by examining in advance the amplitude intensity at the time when the lateral etching amount of the laminated structure to be etched reaches the desired etching amount and setting the amplitude intensity as a threshold value.

Further, an example of determining the etching end point based on the light spectrum (light intensity) detected by the detection unit has been described above, the etching endpoint can also be determined using first-order differential or second-order differential in the wavelength direction of the light spectrum.

FIG. 8A is a spectrum (referred to as a first-order differential light spectrum) obtained by performing first-order differential processing on the light spectrum shown in FIG. 5 in the wavelength direction, and FIG. 8B shows a temporal change in an amplitude intensity of the first-order differential light spectrum. Here, the amplitude intensity is calculated as a difference between a value at a wavelength 560 nm, which corresponds to a peak of the first-order differential light spectrum, and a value at a wavelength 554 nm, which corresponds to a valley of the first-order differential light spectrum.

Similarly, FIG. 9A is a spectrum (referred to as a second-order differential light spectrum) obtained by performing second-order differential processing on the light spectrum shown in FIG. 5 in the wavelength direction, and FIG. 9B shows a temporal change in an amplitude intensity of the second-order differential light spectrum. Here, the amplitude intensity is calculated as a difference between a value at a wavelength 544 nm, which corresponds to a peak of the second-order differential light spectrum, and a value at a wavelength 552 nm, which corresponds to a valley of the second-order differential light spectrum.

In this way, it can be confirmed that the amplitudes of both the first-order differential light spectrum and the second-order differential light spectrum increase as the etching time increases. Therefore, the etching processing end point can be determined based on the first-order differential light spectrum or the second-order differential light spectrum by the same procedure as the flowchart of FIG. 3. An example of determining based on the amplitude has been described, but the determination can also be made based on a spectrum intensity ratio of two wavelengths. However, in this case, since both the first-order differential light spectrum value and the second-order differential light spectrum value may be 0, it is desirable to avoid wavelengths where a differential value is 0, and to take two wavelengths, which are a peak and a valley of vibration of the differential light spectrum value.

Further, another end point determination method will be described with reference to FIGS. 10 to 13. As shown in FIG. 5, the spectrum of the reflected light from the laminated structure vibrates in the wavelength direction. By performing a Fast Fourier Transform (FFT) on the spectrum with periodicity in this way, all frequency components contained in the spectrum can be expressed as a power spectrum (power density for each frequency). As described above, since the amplitude intensity of the light spectrum increases as the lateral etching processing of the tungsten film of the laminated structure progresses, a peak value of the power spectrum corresponding to a vibration frequency in the wavelength direction of the light spectrum also increases. Therefore, the etching end point can be determined by setting, as a determination threshold value, a value of a peak intensity of the power spectrum corresponding to the vibration frequency in the wavelength direction of the spectrum of the reflected light at the time when the lateral etching processing proceeds and a desired film structure shown in FIG. 4C is obtained.

FIG. 10 is a flowchart of the end point determination unit 30 determining the lateral etching end point of the film to be processed of the wafer 16.

First, the following presets are made. As the etching end point conditions, the vibration frequency of the light spectrum of the reflected light and the peak value of the power spectrum corresponding to the vibration frequency, which is the etching end point of the wafer, are set (step 1001). Further, among the light spectrum detected by the detection unit, a wavelength range used for calculating the power spectrum is set (step 1002). This is to facilitate specification of a corresponding peak by limiting a range of the light spectrum used for calculating the power spectrum to a region where vibration in a frequency direction due to the interference light appears remarkably. Further, the number of sampling points of FFT is set (step 1003). Similar to the flow of FIG. 3, these set values are also stored in the storage device of the control unit 40, transmitted to the end point determination unit 30, and used for determining the etching end point.

The control unit 40 starts the processing of the wafer, and the detection unit 28 detects the light spectrum of the reflected light from the wafer obtained during the processing. The detected light spectrum is input into the end point determination unit 30 (step 1004). Here, the processing of step 1005 and subsequent steps may be performed by converting the light spectrum, which is the light intensity data of each wavelength into light intensity data of each wave number (reciprocal of the wavelength) before proceeding to step 1005. It is known that the accuracy of FFT is improved by performing FFT on a light spectrum converted into light intensity data of each wave number.

Next, the end point determination unit 30 performs spline interpolation processing on the light intensity data in the wavelength range set in step 1002 with respect to the light spectrum and obtains data of the number of the sampling points of FFT set in step 1003 with respect to the light spectrum for which the spline interpolation processing is performed (step 1005). At this time, sampling is performed such that sampling intervals are equidistant.

Next, the endpoint determination unit 30 multiplies the sampling data obtained in step 1005 by a window function of FFT (step 1006). Here, an example of using a humming function as the window function is shown, but other window functions may be used in consideration of a shape of the spectrum in the wavelength range set in step 1002. Further, if the multiplication of the window function is unnecessary, the process may proceed to step 1007 without performing step 1006.

Next, the end point determination unit 30 performs FFT processing and calculates the power spectrum for each frequency (step 1007).

Next, the end point determination unit 30 reads the value of the power spectrum (peak value) at the vibration frequency set in step 1001 with respect to the power spectrum obtained in step 1007 (step 1008).

Next, the end point determination unit 30 compares the value of the power spectrum read in step 1008 with the set value set as the etching endpoint of the wafer set in step 1001 (step 1009). When it is determined that the read power spectrum is less than the set value, the process returns to step 1004. When it is determined that the read power spectrum is equal to or greater than the set value, the end point determination unit 30 determines that a target etching amount is reached, and transmits a signal of ending the process to the control unit 40 (step 1010).

The processing in the flowchart in FIG. 10 will be described with reference to FIGS. 11A to 11C. FIG. 11A is a spectrum obtained by the detection unit detecting the reflected light from the wafer 16, and is a light spectrum in a wavelength range of approximately 200 nm to 850 nm. Next, data of the obtained light spectrum is input into the end point determination unit 30, and light spectrum data in a wavelength range to be used for the etching end point determination processing is extracted according to the set value in step 1002. Here, 500 nm to 700 nm is set as the wavelength range to be used. FIG. 11B shows the light spectrum data in the wavelength range with a thick solid line. The spline interpolation processing is performed on the light spectrum data, data of the number of sampling points in which the number of data in the wavelength direction conforms to the set value in step 1003 is generated, and spectrum data obtained by multiplying, by the humming function, the sampling data subjected to the spline interpolation processing is generated. FIG. 11B shows the spectrum data (spectrum data obtained by multiplying by the humming function) obtained in step 1006 with a thin solid line. In step 1007, FFT processing is performed on the spectrum data obtained by multiplying by the humming function, and a power spectrum shown in FIG. 11C is obtained. In this example, a peak of the power spectrum (peak value=340) can be seen at a position of a sampling point (horizontal axis) 12. The sampling point (horizontal axis) 12 corresponds to the vibration frequency in the wavelength direction of the light spectrum. This means that the larger the value of the sampling point, the shorter the period of the vibration in the wavelength direction of the light spectrum. Further, magnitude of the peak (power spectrum intensity) corresponds to magnitude of the amplitude of the vibration in the wavelength direction seen in the spectrum before the FFT processing is executed.

FIG. 12 shows a temporal change in the power spectrum at each time point shown in FIG. 5 (5 seconds, 10 seconds, and 15 seconds after the start of the etching processing). At each time point (5 seconds later: black solid line, 10 seconds later: broken line, 15 seconds later: gray solid line), the peak of the spectrum is also seen at the position of sampling point 12. FIG. 13 shows a relation between the value of the peak value at each time point of the power spectrum and the time in FIG. 12. It can be seen that the peak value increases as the etching time increases. Therefore, according to the procedure of the flowchart in FIG. 10, the etching processing end point can be determined based on the power spectrum of the light spectrum.

As described above, the horizontal axis in FIG. 12 corresponds to the vibration frequency in the wavelength direction of the light spectrum of the reflected light shown in FIG. 5. The vibration frequency in the wavelength direction corresponds to the thickness of the silicon oxide film of the laminated structure. Therefore, it can be determined that the thickness of the silicon oxide film changes when the peak position of the power spectrum changes during etching, so that a defective wafer can also be determined. For the same reason, uniformity of the thicknesses of the silicon oxide film in the film structure can be estimated based on a waveform near the peak position of the power spectrum.

The examples of the etching end point determination method in the present embodiment have been described above. The embodiment described above is merely a part of the embodiments of the present invention, and the embodiments of the present invention are not limited to the above, and various modifications can be made.

For example, in a plasma processing apparatus, plasma generated during plasma processing emits light. The light from the plasma (referred to as plasma light) includes wavelengths in ultraviolet to visible light region and overlaps with wavelength region of light spectrum of the external light, although the light spectrum differs depending on a processing gas. Therefore, when the external light is applied for monitoring an etching amount during light emitting of the plasma, influence of the light emitting of the plasma is added to a light amount detected by the detection unit. Specifically, the detection unit 28 detects the plasma light and reflected light of the plasma light from the wafer in addition to the reflected light of the irradiation light (external light). In this case, since the reflected light of the irradiation light (external light) and the reflected light of the plasma light also increases in the amplitude of the vibration in the wavelength direction as the etching progresses, the etching amount can be calculated and the end point can be determined according to the principle of the present embodiment. However, with respect to the vibration in the wavelength direction of the light spectrum of the interference light, a temporal fluctuation of an emission amount of the plasma light is a background noise, which may reduce an S/N ratio.

As a method of preventing a decrease in the S/N ratio, a temporal fluctuation factor of the plasma light may be removed to calculate the etching amount and determine the end point by further providing a detection unit that mainly detects the emission amount of the plasma light at a position where the interference light from the wafer is not detected as much as possible (for example, a side surface of the processing chamber 10). As another method, it is considered to increase a light emission intensity of the light source unit 18. Accordingly, a ratio of the interference light intensity of the external light to the interference light intensity of the plasma light can be increased, and as a result, the decrease in the S/N ratio due to the temporal fluctuation of the emission amount of the plasma light can be prevented. For example, when an LED is used as the light source unit (external light source), the wafer can be irradiated with irradiation light having a light emission intensity of several times to several dozen times larger than the light emission intensity of the plasma light. These two methods may be used together.

Further, when the plasma processing apparatus 1 performs the plasma etching according to the plasma processing shown in FIG. 2, by irradiating the wafer with the external light at a timing when the plasma is not generated, the etching amount can be calculated and the end point can be determined without being affected by the plasma light. Specifically, the plasma is not generated during the exhaust processing in step 206 in FIG. 2. Alternatively, in step 205, the plasma is not generated during removing the reaction products. Therefore, by irradiating the wafer with external light during a period in which the plasma of step 206 or step 205 is not generated and detecting the reflected light, the etching amount can be calculated and the end point can be determined without being affected by the plasma light.

Further, the external light source (light source unit) is not limited to the LED. A wavelength band in which the vibration in the wavelength direction that appears in the interference light obtained by irradiating the wafer with the external light appears remarkably differs depending on the material and structure of the laminated structure to be etched, and therefore, the etching amount can be accurately monitored by using a light source corresponding to the wavelength band. For example, a xenon lamp, a halogen lamp, and the like can be used as the light source unit 18.

On the contrary, when the vibration in the wavelength direction of the light spectrum of the interference light appears strongly in a light emission band of the plasma light, the etching amount can be calculated by detecting the reflected light of the plasma light from the wafer without using the external light source. A configuration of a plasma processing apparatus 1b in that case is shown in FIG. 14. In the plasma processing apparatus 1b shown in FIG. 14, in order to eliminate the temporal fluctuation factor of the plasma light, a second detection unit 52 that mainly detects the emission amount of plasma light is provided on a side surface of the processing chamber 10 to improve the accuracy of the end point determination. The same configuration as that of the plasma processing apparatus 1 shown in FIG. 1 is shown with the same reference numeral. A lens 51 mainly collects the plasma light, and the second detection unit 52 measures an intensity of the plasma light. By calculating the etching amount and performing the end point determination processing while eliminating the influence of the temporal fluctuation of the intensity of the plasma light, the accuracy of the etching processing can be improved.

Further, in the present embodiment, the laminated structure containing the tungsten films shown in FIGS. 4A to 4C is shown as an example, but the application can be applied to a laminated structure in which a film containing a metal is used as a film to be processed. For example, similar etching amount monitoring can also be performed for a laminated structure having a Ni, Co, Mo film or an oxide film thereof as a film to be processed. Further, the insulating film of the laminated structure is not limited to the silicon oxide film, and may be an insulating film such as a silicon oxynitride film.

REFERENCE SIGN LIST 1 and 1b: plasma processing apparatus
10: processing chamber
12: plasma
14: sample stage
16: wafer
18: light source unit
20, 26, and 51: lens
22: irradiation light
24: reflected light
28 and 52: detection unit
30: end point determination unit
31: display unit
40: control unit
401: base film
402: tungsten film
403: silicon oxide film
404: reaction species
405: reaction product
411: groove

The invention claimed is:

1. A plasma processing apparatus that performs, on a wafer in which a multilayer film in which an insulating film and a film to be processed containing a metal are alternately laminated is formed on a substrate, plasma etching of the film to be processed, the plasma processing apparatus comprising:
a processing chamber which is disposed inside a vacuum container;
a sample stage which is disposed inside the processing chamber and on which the wafer is placed;
a detection unit which detects reflected light obtained by the wafer reflecting light emitted to the wafer;
a control unit which controls plasma processing on the wafer; and
an end point determination unit which determines an etching end point of the film to be processed based on a change in an amplitude of vibration in a wavelength direction of a light spectrum of the reflected light, wherein
the control unit receives determination of the endpoint made by the end point determination unit and stops the plasma processing on the wafer.

2. The plasma processing apparatus according to claim 1, further comprising:
a light source; and
a first lens and a second lens which are disposed on a ceiling surface of the processing chamber, wherein
light from the light source is emitted to the wafer through the first lens, and the reflected light received by the second lens is detected by the detection unit.

3. The plasma processing apparatus according to claim 2, wherein
the control unit performs control such that light from the light source is emitted to the wafer at a timing when plasma is not generated in the processing chamber.

4. The plasma processing apparatus according to claim 1, further comprising:
a lens disposed on a ceiling surface of the processing chamber, wherein
light from plasma generated in the processing chamber is emitted to the wafer, and the reflected light received by the lens is detected by the detection unit.

5. The plasma processing apparatus according to claim 1, wherein
the end point determination unit determines the etching end point of the film to be processed when an intensity ratio of an intensity of reflected light at a first wavelength to an intensity of reflected light at a second wavelength is equal to or larger than a predetermined set value, and
the first wavelength and the second wavelength are set as wavelengths which are respectively a peak and a valley of the vibration in the wavelength direction of the light spectrum of the reflected light.

6. The plasma processing apparatus according to claim 1, wherein
the end point determination unit determines the etching end point of the film to be processed when a difference between an intensity of reflected light at a first wavelength and an intensity of reflected light at a second wavelength is equal to or larger than a predetermined set value, and
the first wavelength and the second wavelength are set as wavelengths which are respectively a peak and a valley of the vibration in the wavelength direction of the light spectrum of the reflected light.

7. The plasma processing apparatus according to claim 1, wherein
the end point determination unit calculates a differential light spectrum obtained by performing first-order differential processing or second-order differential processing on the light spectrum of the reflected light in the wavelength direction, and determines the etching end point of the film to be processed based on a change in an amplitude of vibration in a wavelength direction of the differential light spectrum.

8. The plasma processing apparatus according to claim 1, wherein the end point determination unit calculates a power spectrum of the light spectrum of the reflected light, and determines the etching end point of the film to be processed when a peak value of the power spectrum corresponding to a vibration frequency of the vibration in the wavelength direction of the light spectrum of the reflected light is equal to or larger than a predetermined set value.

9. The plasma processing apparatus according to claim 1, wherein
the insulating film is a silicon oxide film and the film to be processed is a tungsten film.

10. A plasma processing method in which a plasma processing apparatus including a processing chamber which is disposed inside a vacuum container, a sample stage which is disposed inside the processing chamber and on which a wafer is placed, a light detection unit, a control unit which controls plasma processing on the wafer, and an end point determination unit which determines a plasma etching end point of the wafer, is used to perform, on a wafer in which a multilayer film in which an insulating film and a film to be processed containing a metal are alternately laminated is formed on a substrate, plasma etching of the film to be processed, the plasma processing method comprising:

using the light detection unit to detect reflected light obtained by the wafer reflecting light emitted to the wafer;

using the end point determination unit to determine an etching end point of the film to be processed based on a change in an amplitude of vibration in a wavelength direction of a light spectrum of the reflected light; and using the control unit to receive determination of the end point made by the end point determination unit and stop the plasma processing on the wafer.

11. The plasma processing method according to claim 10, wherein
the plasma processing apparatus further includes alight source, and
the control unit performs control such that light from the light source is emitted to the wafer at a timing when plasma is not generated in the processing chamber.

12. The plasma processing method according to claim 10, wherein
the end point determination unit determines the etching end point of the film to be processed when an intensity ratio of an intensity of reflected light at a first wavelength to an intensity of reflected light at a second wavelength or a difference between the intensity of the reflected light at the first wavelength and the intensity of the reflected light at the second wavelength is equal to or larger than a predetermined set value, and
the first wavelength and the second wavelength are set as wavelengths which are respectively a peak and a valley of the vibration in the wavelength direction of the light spectrum of the reflected light.

13. The plasma processing method according to claim 10, wherein
the end point determination unit calculates a differential light spectrum obtained by performing first-order differential processing or second-order differential processing on the light spectrum of the reflected light in the wavelength direction, and determines the etching end point of the film to be processed based on a change in an amplitude of vibration in a wavelength direction of the differential light spectrum.

14. The plasma processing method according to claim 10, wherein
the end point determination unit calculates a power spectrum of the light spectrum of the reflected light, and determines the etching end point of the film to be processed when a peak value of the power spectrum corresponding to a vibration frequency of the vibration in the wavelength direction of the light spectrum of the reflected light is equal to or larger than a predetermined set value.

15. The plasma processing method according to claim 10, wherein
the insulating film is a silicon oxide film and the film to be processed is a tungsten film.

\* \* \* \* \*